(12) United States Patent
Dip et al.

(10) Patent No.: US 7,524,769 B2
(45) Date of Patent: Apr. 28, 2009

(54) METHOD AND SYSTEM FOR REMOVING AN OXIDE FROM A SUBSTRATE

(75) Inventors: Anthony Dip, Cedar Creek, TX (US); Allen John Leith, Austin, TX (US); Seungho Oh, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 352 days.

(21) Appl. No.: 11/094,462

(22) Filed: Mar. 31, 2005

(65) Prior Publication Data

US 2006/0228900 A1 Oct. 12, 2006

(51) Int. Cl.
*H01L 21/302* (2006.01)

(52) U.S. Cl. .................. 438/711; 438/700; 438/707; 438/710; 257/E21.226

(58) Field of Classification Search .................. None
See application file for complete search history.

(56) References Cited

U.S. PATENT DOCUMENTS

| | | | |
|---|---|---|---|
| 5,089,441 A * | 2/1992 | Moslehi ............... | 438/800 |
| 5,308,788 A * | 5/1994 | Fitch et al. ............ | 117/86 |
| 5,352,636 A * | 10/1994 | Beinglass ............. | 438/475 |
| 5,380,399 A * | 1/1995 | Miyashita et al. ...... | 438/694 |
| 5,510,277 A | 4/1996 | Cunningham et al. | |
| 5,885,361 A | 3/1999 | Kikuchi et al. | |
| 6,365,516 B1 | 4/2002 | Frenkel et al. | |
| 2002/0009892 A1* | 1/2002 | Cohen et al. ........... | 438/710 |
| 2002/0098627 A1* | 7/2002 | Pomarede et al. ...... | 438/149 |

FOREIGN PATENT DOCUMENTS

JP 2002-324760 11/2002

OTHER PUBLICATIONS

"High silicon etch rates by hot filament generated atomic hydrogen," Wanka, H.N., Schubert, M.B., Journal of Physics D: Applied Physics, Apr. 21, 1997, 30 No. 8 L28-L31.

* cited by examiner

*Primary Examiner*—N Drew Richards
*Assistant Examiner*—Kyoung Lee
(74) *Attorney, Agent, or Firm*—Oblon, Spivak, McClelland Maier & Neustadt, P.C.

(57) ABSTRACT

A method and system for processing a substrate includes providing the substrate in a process chamber, where the substrate contains an oxide layer formed thereon, exciting a hydrogen-containing gas in a remote plasma source coupled to the process chamber, and exposing the substrate to a flow of the excited hydrogen-containing gas at a first substrate temperature lower than about 900° C. to remove the oxide layer from the substrate. The substrate is then maintained at a second temperature different than the first substrate temperature, and a silicon-containing film is formed on the substrate at the second substrate temperature.

24 Claims, 6 Drawing Sheets

METHOD AND SYSTEM FOR REMOVING AN OXIDE FROM A SUBSTRATE

CROSS REFERENCE TO RELATED APPLICATIONS

The present invention is related to U.S. patent application Ser. No. 10/673,375, titled "DEPOSITION OF SILICON-CONTAINING FILMS FROM HEXACHLORODISILANE", the entire contents of which are hereby incorporated by reference.

FIELD OF THE INVENTION

The present invention relates to processing a substrate and more particularly, to low-temperature oxide removal from a substrate and subsequent formation of a silicon-containing film on the substrate.

BACKGROUND OF THE INVENTION

Silicon-containing films are used for a wide variety of applications in the semiconductor industry. Silicon-containing films include silicon films such as epitaxial silicon, polycrystalline silicon (poly-Si), amorphous silicon, epitaxial silicon germanium (SiGe), silicon germanium carbide (SiGeC), silicon carbide (SiC), silicon nitride (SiN), silicon carbonitride (SiCN), and silicon carboxide (SiCO). As circuit geometries shrink to ever smaller feature sizes, lower deposition temperatures are preferred, for example because of introduction of new materials into semiconductor devices and reduction of thermal budgets of shallow implants in source and drain regions. Moreover, it is evident that non-selective (blanket) and selective deposition of silicon-containing films will be needed for future devices.

Epitaxial silicon deposition is a process where the crystal lattice of the bulk silicon is extended through growth of a new silicon-containing film that may have a different doping level than the bulk. Matching target epitaxial film thickness and resistivity parameters is important for the subsequent fabrication of properly functioning devices. Prior to depositing a silicon-containing film on a substrate, for example epitaxial silicon or epitaxial silicon germanium films on a silicon substrate, it may be required to remove a native oxide layer from the surface of the substrate in order to deposit a high quality epitaxial film. A native oxide layer that is typically a few to several Angstroms (Å) thick, forms easily on clean silicon surfaces, even at room temperature and atmospheric pressure. If the substrate is not cleaned prior to depositing a silicon-containing film on the substrate, i.e., all oxygen and other contaminants removed from the substrate surface, the subsequently deposited silicon-containing film will contain defects that can lead to a high leakage current through the film and cause the microelectronic device to not perform optimally.

Similarly, a poly-Si film can be deposited directly on a poly-Si film to form an electrical contact. Because other processing typically occurs between the poly-Si deposition steps, the substrates (wafers) can be removed from the processing system between the deposition steps, which can form a native oxide layer on the substrates. If the native oxide layer is not removed prior to depositing the poly-Si film, the resulting contact can have high electrical resistance.

Traditionally, a high-temperature anneal of above 900° C. in a hydrogen atmosphere is used in (vertical) batch-type processing systems to remove a native oxide layer from substrates and clean the substrates of other impurities prior to a deposition process. However, such a high-temperature process does not meet current or future thermal budget needs for many advanced processes. For example, it is well known that current gate lengths and modern microelectronic structures limit devices to a reduced thermal budget. As an alternative to high-temperature annealing in a hydrogen atmosphere, plasma processing has been found to allow lowering of the substrate temperature during processing. However, exposure of the substrate to a plasma source can result in damage to the substrate. Moreover, use of a plasma has been suggested to reduce an oxide removal temperature to a level equal to a temperature of subsequent processing steps. However, the present inventors have recognized that this places an undesirable restriction on the temperature of processing steps.

SUMMARY OF THE INVENTION

Accordingly, it is an object of the present invention to address the above-described problems associated with removing oxide from a substrate.

Another object of the present invention is to allow removal of oxide from a substrate at a low process temperature, while reducing damage to the substrate.

Still another object of the invention is to provide flexibility in the temperature of an oxide removal step.

These and/or other objects can be provided by a method for processing a substrate. According to an embodiment of the invention, the method includes providing the substrate in a process chamber of a batch-type processing system, where the substrate contains an oxide layer formed thereon, exciting a hydrogen-containing gas in a remote plasma source coupled to the process chamber, exposing the substrate to a flow of the excited hydrogen-containing gas at a first substrate temperature lower than about 900° C. to remove the oxide layer from the substrate, maintaining the substrate at a second temperature different than the first substrate temperature, and forming a silicon-containing film on the substrate at the second substrate temperature.

Another aspect of the invention includes a system for processing a substrate including a process chamber configured to contain a substrate having an oxide layer formed thereon, and a remote plasma source coupled to the process chamber and configured to excite a hydrogen-containing gas. Also included is a gas supply line configured to flow gas into the process chamber, and a heat source configured to heat the substrate. A controller is configured to cause the heat source to heat the substrate to a first temperature less than about 900° C., and cause the gas supply line flow the excited hydrogen-containing gas to the process chamber so that the substrate heated to the first temperature is exposed to the excited hydrogen-containing gas. The controller is further configured to cause the heat source to heat the substrate to a second temperature different than the first temperature, and flow a silicon-containing gas to the process chamber so that the substrate heated to the second temperature is exposed to the silicon-containing gas.

DETAILED DESCRIPTION OF SEVERAL EMBODIMENTS OF THE INVENTION

In the following description, in order to facilitate a thorough understanding of the invention and for purposes of explanation and not limitation, specific details are set forth, such as a particular geometry of the batch-type processing system and descriptions of various components. However, it should be understood that the invention may be practiced in other embodiments that depart from these specific details.

Figure 1:
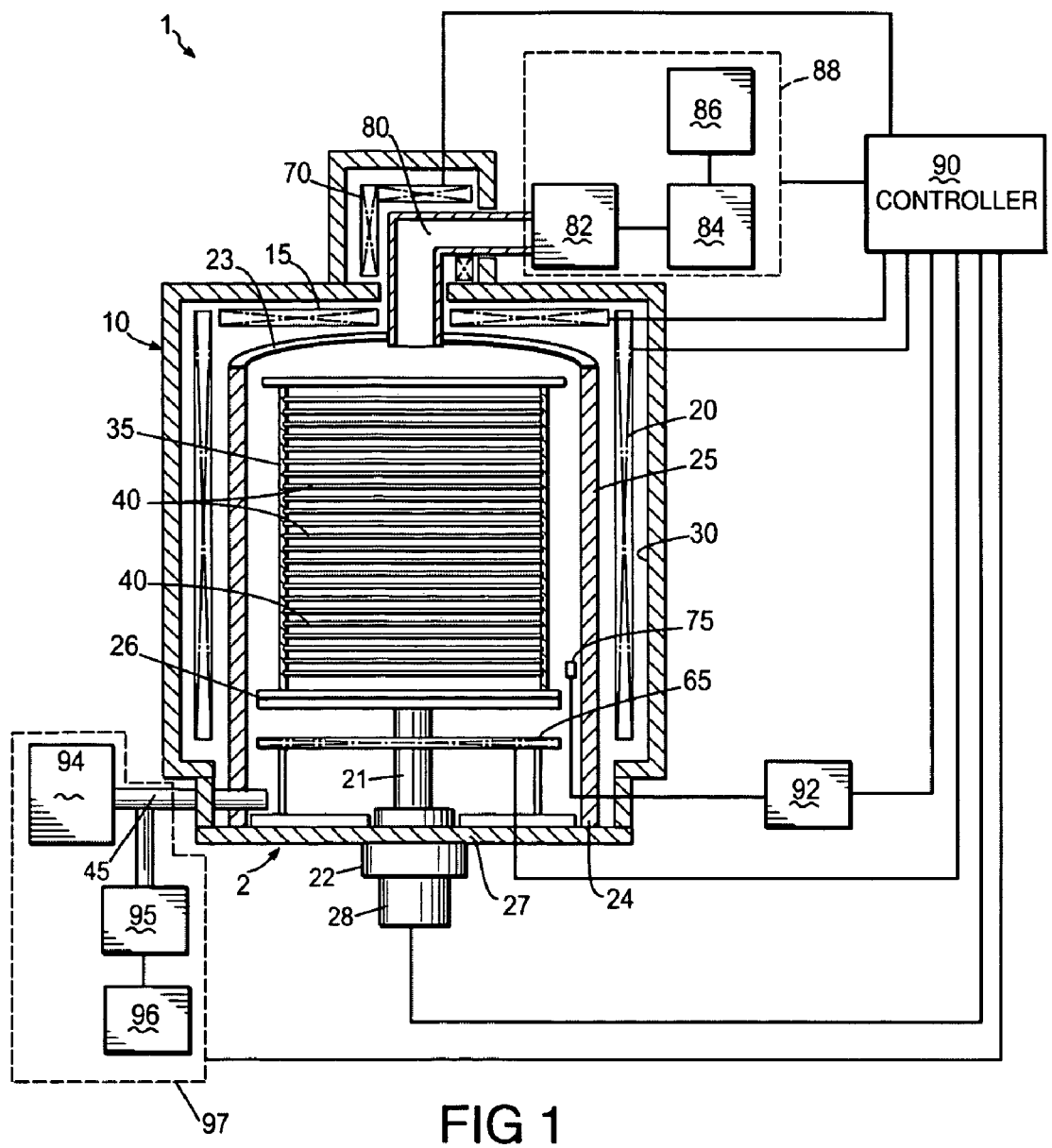
FIG. 1 shows a simplified block diagram of a batch-type processing system according to an embodiment of the invention.

Referring now to the drawings, FIG. 1 shows a simplified block diagram of a batch-type processing system according to an embodiment of the invention. The batch-type processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A gas delivery system 97 is configured for introducing gases into the process chamber 10. A plurality of gas supply lines can be arranged around the manifold 2 to supply a plurality of gases into the process tube 25 through the gas supply lines. In FIG. 1, only one gas supply line 45 among the plurality of gas supply lines is shown. The gas supply line 45 shown, is connected to a gas source 94. In general, the gas source 94 can supply process gases for processing the substrates 40, including, gases for depositing films (e.g., silicon-containing gases for depositing silicon-containing films) onto the substrates 40, gases for etching the substrates 40, or gases for oxidizing the substrates 40. A (remote) plasma source 95 is operatively coupled to the process chamber 10 by the gas supply line 45. The plasma source 95 is configured for exciting a hydrogen-containing gas from the gas source 96, and the excited (dissociated) hydrogen-containing gas is subsequently introduced into the process tube 25 by the gas supply line 45 of the gas delivery system 97. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as a cooling medium passage.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas injection system 97 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a MS, a FTIR spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or it may be remotely located relative to the processing system 1 via an internet or intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch-type processing system 1 depicted in FIG. 1 is shown for exemplary purposes only, as many variations of the specific hardware can be used to practice the present invention, and these variations will be readily apparent to one having ordinary skill in the art. The processing system 1 in FIG. 1 can, for example, process substrates of any size, such as 200 mm substrates, 300 mm substrates, or even larger substrates. Furthermore, the processing system 1 can simultaneously process up to about 200 substrates, or more. Alternately, the processing system can simultaneously process up to about 25 substrates. In addition to semiconductor substrates, e.g., silicon wafers, the substrates can, for example, comprise LCD substrates, glass substrates, or compound semiconductor substrates.

The current inventors have realized that traditional high-temperature hydrogen anneals of above 900° C. that are performed to remove an oxide layer and other impurities from a substrate prior to processing do not meet current or future thermal budget needs. Thus, lower-temperature processes for removing an oxide layer are needed that are compatible with advanced device processing requiring a low thermal budget. While plasma processing utilizing a plasma source can be used to remove oxide at lower temperatures, such plasma processing can also result in damage to the substrate. The present inventors have recognized that this damage can result from high-energy species (e.g., ions and electrons) in the plasma environment bombarding the substrate because the substrate is in direct line of sight of the plasma. In addition, damage or etching of a substrate material (e.g., silicon) can result from plasma processing if the substrate temperature is too high, for example, greater than about 900° C.

The present inventors have recognized that the above mentioned problems associated with removing an oxide layer from a substrate prior to processing (such as forming a silicon-containing film on the substrate) can be addressed by exciting a hydrogen-containing gas in a remote plasma source coupled to the process chamber, and exposing a substrate to the excited hydrogen-containing gas, where the remote plasma source is not in direct line of sight of the substrate(s) to be processed in the process chamber. This configuration can provide lower temperature plasma processing at less than 900° C., while reducing substrate damage. While it has been suggested, for example in Japanese patent publication number 2002-324760, that a remote plasma source can be used for removing a native oxide, this reference implements the remote plasma so that the oxide removal step can be performed at the same temperature as a subsequent processing step. While this restriction may provide improved throughput for a processing system, the present inventors have recognized that it is often desirable that different processing steps be performed at different temperatures to optimize process results.

Based on this recognition, an embodiment of the present invention further provides that following removal of the oxide layer at the first substrate temperature, the substrate temperature is subsequently maintained at a different temperature and a silicon-containing film is formed on the substrate by exposing the substrate to a silicon-containing gas. Thus, the oxide removal step of the present invention is not restricted based on processing temperatures of other process steps. In one embodiment, the silicon-containing film is formed on the substrate at a second substrate temperature greater than the first substrate temperature to achieve deposition rates that are high enough for device manufacturing and to ensure that the deposited silicon-containing film has the desired material properties. The desired material properties can, for example, include a crystal structure (i.e., epitaxial, polycrystalline, or amorphous), and elemental composition. Furthermore, the second substrate temperature can be selected to provide selective film deposition on exposed silicon-containing surfaces of the substrate, or non-selective (blanket) film deposition on the whole substrate. In order to prevent formation of a new oxide layer on the substrate, the silicon-containing film can be formed on the substrate without exposing the substrate to ambient air.

Figure 2A:
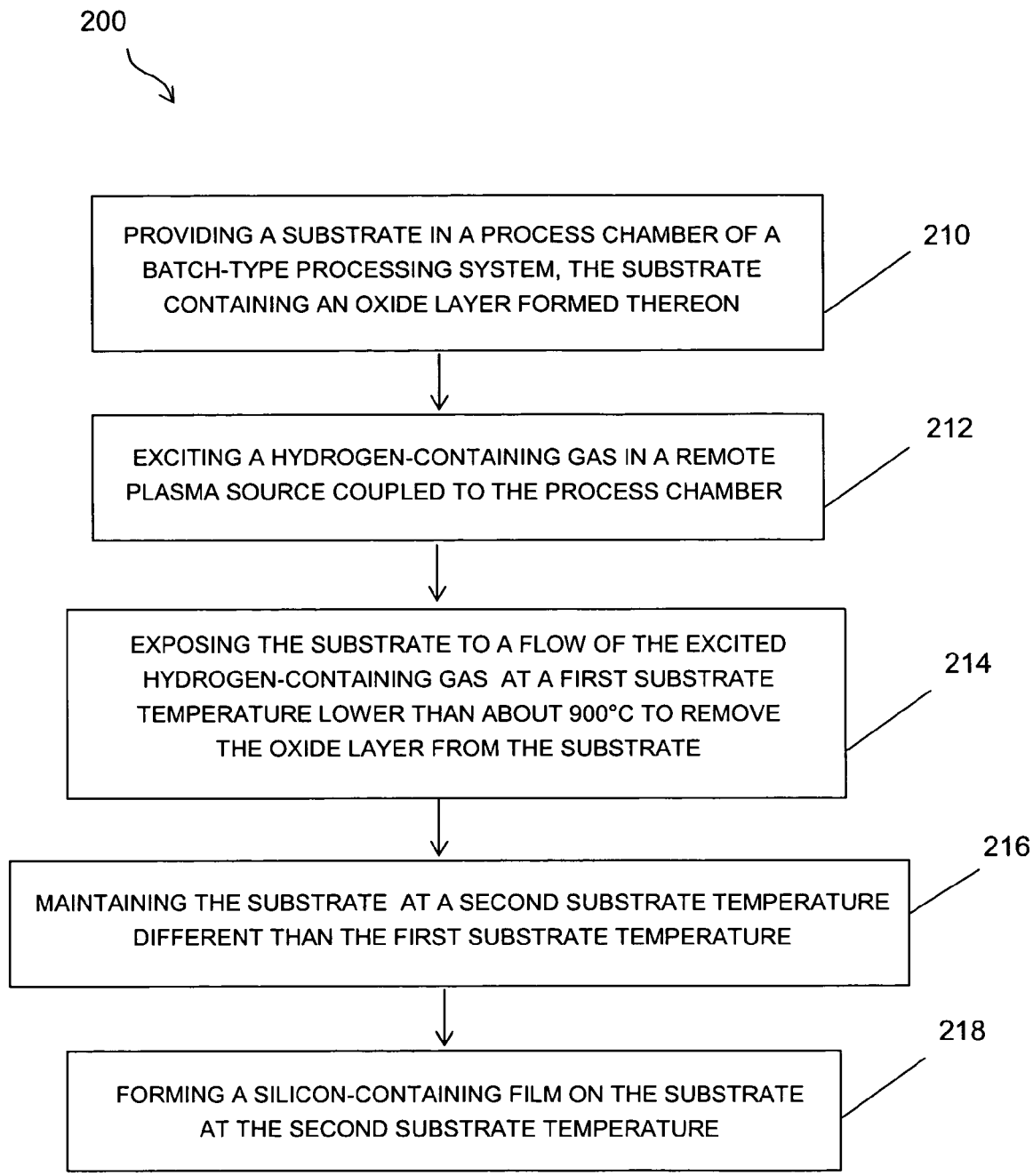
FIG. 2A is a flow diagram for oxide removal from a substrate in a batch-type processing system and subsequent deposition of a silicon-containing film onto the substrate according to an embodiment of the invention.
Figure 2B:
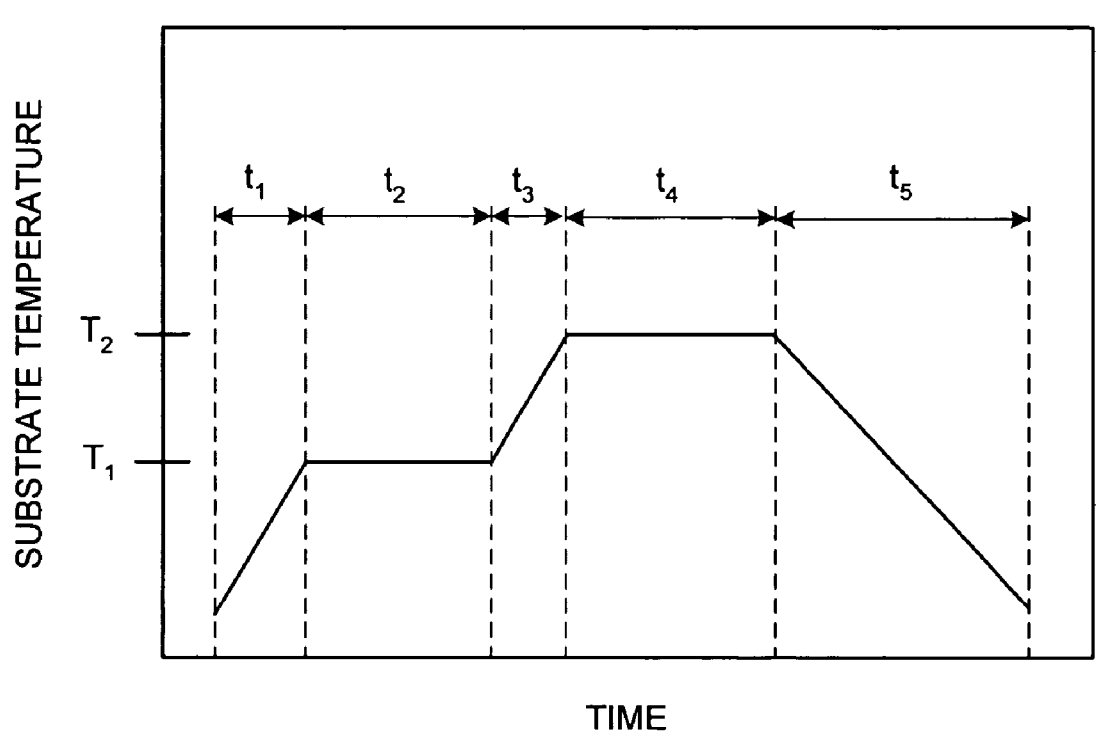
FIG. 2B shows substrate temperature as a function of processing time for oxide removal from a substrate and subsequent deposition of a silicon-containing film onto the substrate according to an embodiment of the invention.

Reference will now be made to FIGS. 2A and 2B. FIG. 2A is a flow diagram for oxide removal from a substrate in a batch-type processing system and subsequent deposition of a silicon-containing film onto the substrate according to an embodiment of the invention. FIG. 2B shows substrate temperature as a function of processing time for oxide removal from a substrate and subsequent deposition of a silicon-containing film onto the substrate according to an embodiment of the invention. Referring now to FIG. 2A, the process 200 includes, at 210, providing a substrate in a process chamber of a batch-type processing system, where the substrate contains an oxide layer formed thereon. The substrate can, for example, be a semiconductor substrate, such as a silicon substrate, a germanium-containing silicon substrate, a germanium substrate, or a compound semiconductor substrate, and can include numerous active devices and/or isolation regions. Furthermore, the substrate can contain vias or trenches or combinations thereof.

After providing a substrate in the process chamber in 210, the substrate is heated to a first substrate temperature $T_1$ during time period to as shown in FIG. 2B. In one embodiment, $T_1$ is less than about 500° C. to reduce process damage, such as etch damage to the substrate. However, as would be understood by one of ordinary skill in the art, the thermal budget and damage allowance varies among different processes and devices. Thus, it is sufficient for purposes of the present invention that $T_1$ be less than about 900° C., which is conventionally used for oxide removal. The time period to is a transition step and can, for example, be between about 2 min and about 15 min, but this is not required for the invention.

At 212, a hydrogen-containing gas is excited in a remote plasma source that is coupled to the process chamber. The plasma source can, for example, include a microwave plasma source, a radio frequency (RF) plasma source, or a plasma source powered by light radiation. According to an embodiment of the invention, the hydrogen-containing gas can be hydrogen ($H_2$). According to another embodiment of the invention, the hydrogen-containing gas can contain $H_2$ and an inert gas. The inert gas can, for example, contain argon (Ar), helium (He), neon (Ne), krypton (Kr), or xenon (Xe), or a combination of two or more thereof. According to one embodiment of the invention, the hydrogen-containing gas can contain $H_2$ and Ar. The addition of Ar gas to the excited hydrogen gas has been shown to reduce the recombination of atomic hydrogen downstream from the plasma source, thereby increasing the lifetime of the atomic hydrogen in the gas flow containing the hydrogen-containing gas, and thus exposing the substrate(s) to higher concentration of atomic hydrogen that can provide more efficient oxide removal.

At 214, during time period $t_2$, the substrate is exposed to a flow of the excited hydrogen-containing gas at a first substrate temperature $T_1$ lower than about 900° C. to remove the oxide layer from a silicon-containing surface of the substrate. The first substrate temperature $T_1$ can be selected in consideration of the overall thermal budget and/or to allow efficient removal of the oxide layer from the substrate while minimizing damage such as etching of the substrate material or other materials formed on the substrate material. For example, where a thermal budget allows for higher temperatures and substrate etching is of little concern, then $T_1$ may approach conventional temperatures of 900° C. However, use of a remote plasma source according to the present invention can minimize damage to the substrate by reducing the number of high energy species reaching the substrate. According to an embodiment of the invention, the first substrate temperature can be less than about 500° C. and greater than about 0° C., or between 200° C. and 300° C. The processing conditions for the oxide removal can include a gas pressure less than about 100 Torr in the process chamber. Alternately, the gas pressure can be less than about 10 Torr in the process chamber. A gas flow rate between about 0.010 standard liters per minute (slm) and about 20 slm can be used for the hydrogen-containing gas.

Following removal of the oxide layer from the substrate, at 216, the substrate is heated during time period $t_3$ from the first substrate temperature $T_1$ to a second substrate temperature $T_2$ different than the first substrate temperature $T_1$. In the embodiment shown in FIG. 2B, the second temperature is higher than the first temperature. In one embodiment, the hydrogen-containing gas is evacuated prior to or during the time period $t_3$ to minimize etch damage to the substrate. Time period $t_3$ is a transition step and may be variable in length depending on system design and processing temperature differences between the oxide removal step at substrate temperature $T_1$ and the substrate temperature $T_2$. The time period $t_3$ can, for example, be between about 5 min and about 45 min, but this is not required for the invention. According to an embodiment of the invention, the second substrate temperature $T_2$ can be between about 500° C. and about 900° C. According to another embodiment of the invention, the second substrate temperature $T_2$ can be between about 550° C. and about 750° C. In one embodiment of the invention, the first process temperature $T_1$ is between about 200° C. and 300° C., while the second temperature $T_2$ is between about 550° C. and 750° C. However, the process temperature may be used in accordance with the present invention.

At 218, a silicon-containing film is formed on the substrate at the second substrate temperature T2. The silicon-containing film is formed on the substrate following the removal of the oxide layer without exposing the silicon-containing surface to ambient air that can form an oxide layer on the substrate. According to an embodiment of the invention, the silicon-containing film can be formed on the substrate by exposing the substrate to a silicon-containing gas including, for example, $SiH_4$, $SiCl_4$, $Si_2H_6$, $SiH_2Cl_2$, or $Si_2Cl_6$, or a combination of two or more thereof. According to an embodiment of the invention, the silicon-containing gas can further contain a germanium-containing gas, including, for example, $GeH_4$, $GeCl_4$, or a combination thereof. The silicon-containing film can be formed by providing a silicon-containing gas from a non-plasma gas source such as the source 94 in FIG. 1. However, gas from the gas source such as the source 96 of FIG. 1 may be excited by the plasma source 95 may also be used to assist deposition. Time period $t_4$ is a film forming step and generally depends on the desired film thickness. For many applications with film thickness less than about 500 angstroms, the time period $t_4$ can be less than about one hour.

When a silicon-containing film with a desired thickness has been formed on the substrate, flow of the silicon-containing gas is stopped, the substrate is allowed to cool down during time period $t_5$ and is subsequently removed from the process chamber. Like time periods $t_1$ and $t_3$, the time period $t_5$ is a transition step and may be variable in length. Time period $t_5$ can, for example, be between about 2 min and about 15 min, but this is not required for the invention.

As would be appreciated by those skilled in the art, each of the steps or stages in the flowchart of FIG. 2B may encompass one or more separate steps and/or operations. Accordingly, the recitation of only five steps in 210, 212, 214, 216, and 218 should not be understood to limit the method of the present invention solely to five steps or stages. Moreover, each representative step or stage 210, 212, 214, 216, 218 should not be understood to be limited to only a single process.

Figure 3A:
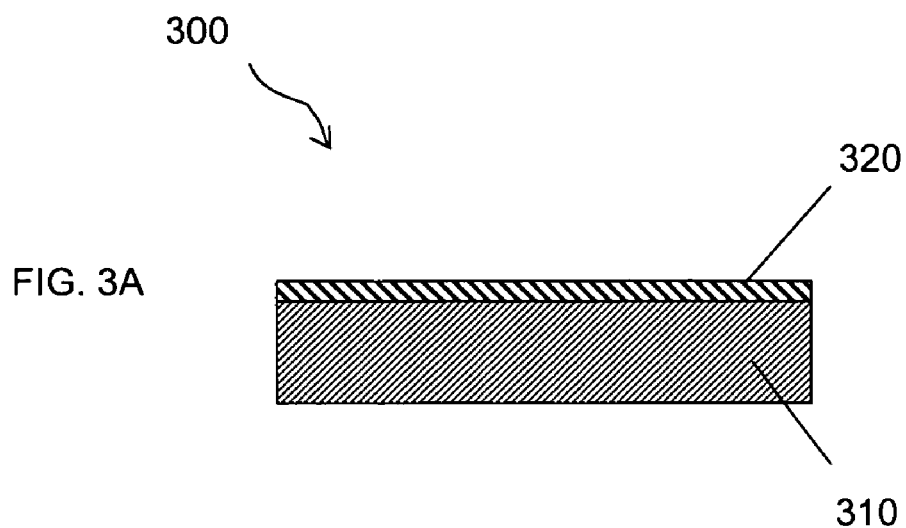
FIGS. 3A-3C schematically show oxide removal from a substrate and subsequent deposition of a silicon-containing film onto the substrate according to an embodiment of the invention.
Figure 3B:
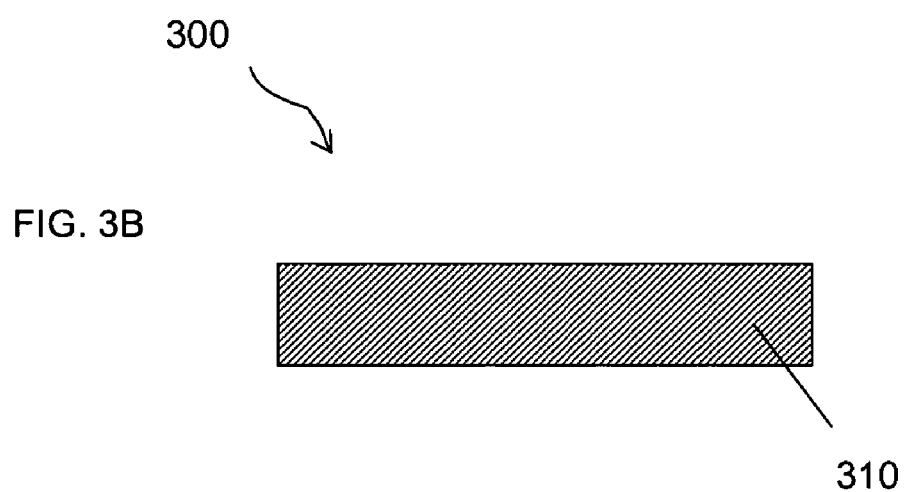
Figure 3C:
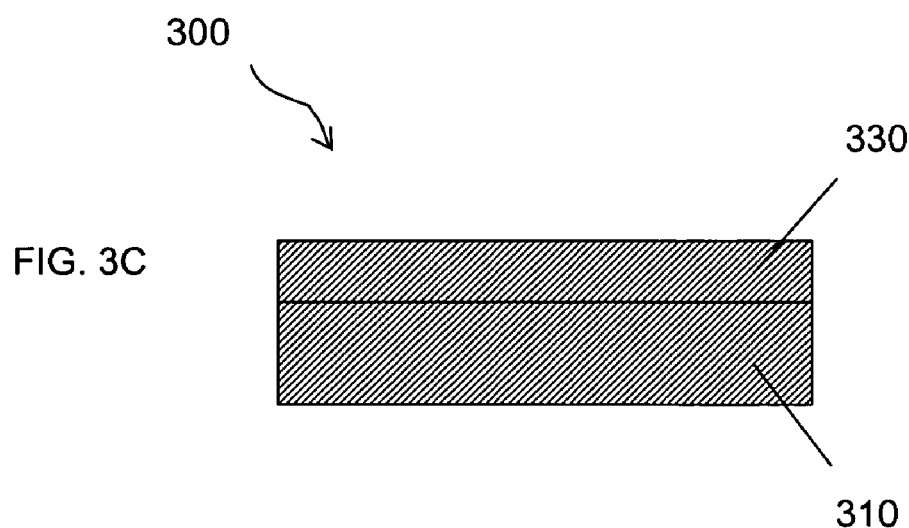

FIGS. 3A-3C schematically show oxide removal from a substrate and subsequent deposition of a silicon-containing film onto the cleaned substrate according to the process described in the flow diagram of FIG. 2A. FIG. 3A shows a structure 300 containing a substrate 310 and an oxide layer 320 formed on the substrate 310. According to an embodiment of the invention, the oxide layer 320 can be a native oxide layer. The substrate 310 can, for example, contain silicon, SiGe, SiGeC, SiC, SiN, SiCN, or SiCO. The presence of the oxide layer 320 on the substrate 310 can inhibit formation of a proper silicon-containing seed (nucleation) film and thereby affect silicon deposition on the structure 300.

FIG. 3B shows the structure 300 following removal of the oxide layer 320 from the substrate 310 according to an embodiment of the invention. FIG. 3C shows the structure 300 following subsequent deposition of a silicon-containing film 330 onto the substrate 310. The film 330 can, for example, be an epitaxial silicon film where the crystal lattice of the silicon substrate 310 is extended through growth of the new silicon film 330. Alternately, the deposited film 330 can be a poly-Si film or an amorphous silicon film. Still alternately, the deposited film 330 can be SiGe film.

Figure 4A:
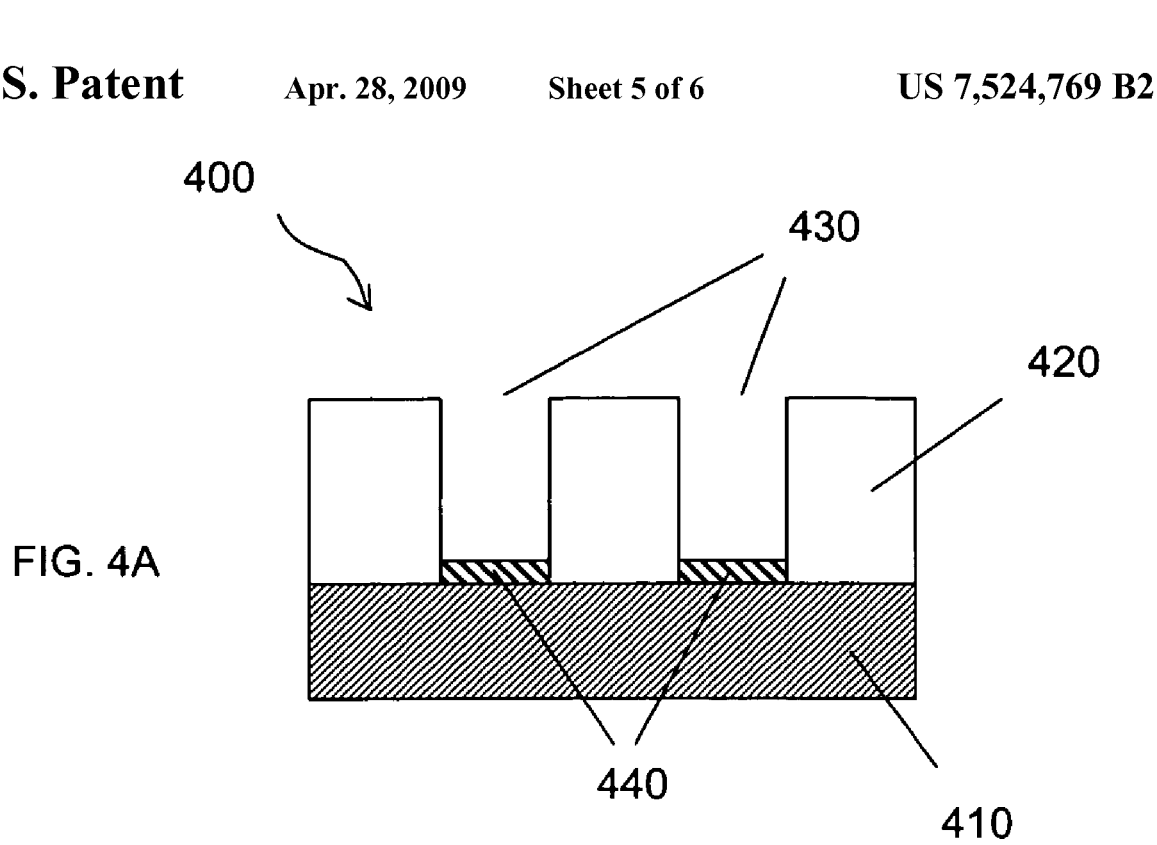
FIGS. 4A-4D schematically show oxide removal from a patterned structure and subsequent deposition of a silicon-containing film onto the patterned structure according to an embodiment of the invention.

FIGS. 4A-4D schematically show oxide removal from a patterned structure and subsequent deposition of a silicon-containing film onto the patterned structure according to an embodiment of the invention. FIG. 4A shows a patterned structure 400 containing a substrate 410, a patterned film 420, and an oxide layer 440 formed on the substrate 410 in the openings 430. The openings 430 can, for example, be vias or trenches, or combinations thereof. The patterned structure 400 is an exemplary structure used in the device manufacturing and can contain a silicon substrate 410 and an overlying photolithographically patterned oxide layer 420.

Figure 4B:
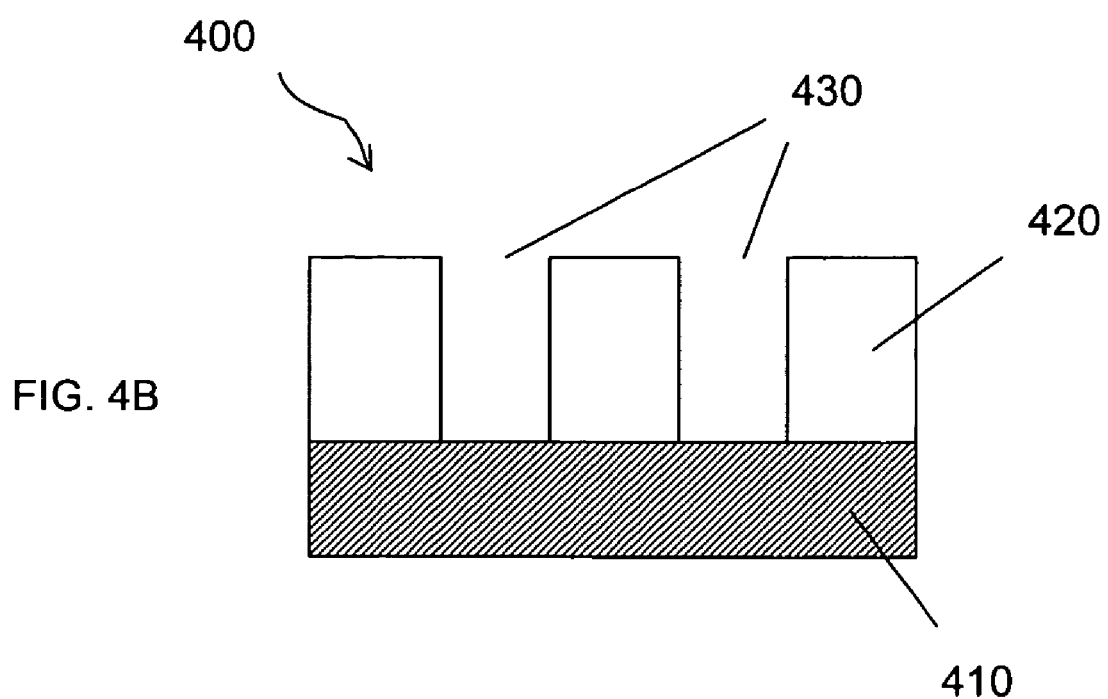

FIG. 4B shows the patterned structure 400 following removal of the oxide layer 440 from the openings 430 according to the process described in the flow diagram of FIG. 2. According to an embodiment of the invention, the oxide layer can be removed by providing the substrate in a process chamber of a batch-type processing system, exciting a hydrogen-containing gas in a plasma source operatively coupled to the process chamber, exposing the substrate at a first substrate temperature lower than about 500° C. to the excited gas to remove the oxide layer from a silicon-containing surface of the substrate.

Figure 4C:
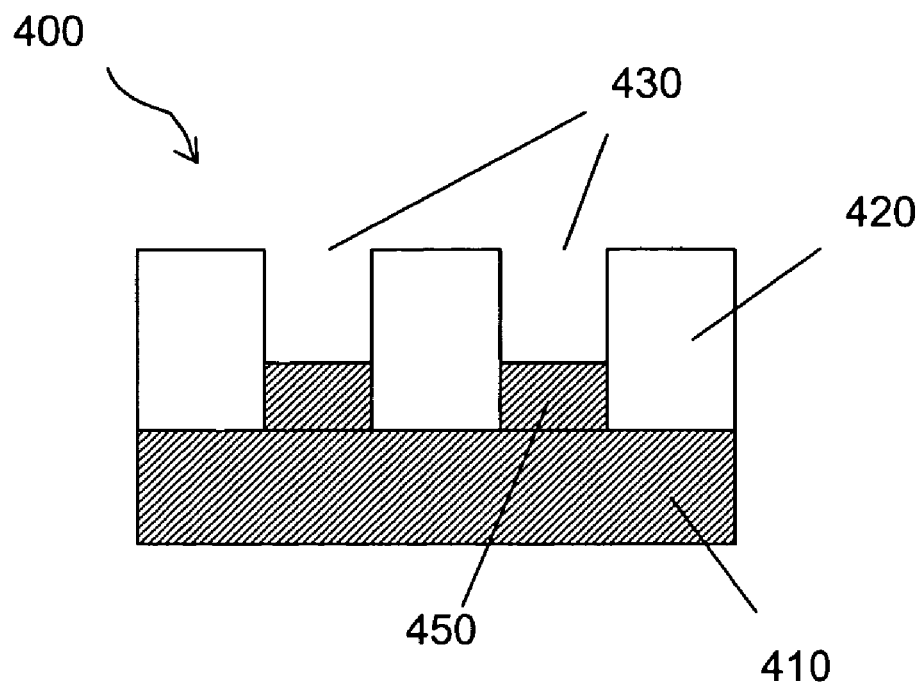

FIG. 4C shows the patterned structure 400 following selective deposition of a silicon-containing film 450 onto the exposed portion of the substrate 410. The selectively deposited film 450 can, for example, be an epitaxial silicon film deposited on a silicon substrate 410. The epitaxial silicon film 450 can, for example, be selectively deposited on the exposed portion of the silicon substrate 410 in the batch-type processing system 1 shown in FIG. 1, using, for example, a process gas containing $Si_2Cl_6$, a substrate temperature of about 800° C. Alternately, the substrate temperature can be between about 550° C. and about 750° C. Further details of utilizing HCD gas to deposit silicon-containing films are described in U.S. patent application Ser. No. 10/673,375, filed Sep. 30, 2003, and titled "DEPOSITION OF SILICON-CONTAINING FILMS FROM HEXACHLORODISILANE", the entire contents of which are hereby incorporated by reference.

The selective deposition of the epitaxial silicon-containing film 450 allows for subsequent removal of the patterned film 420 using methods known to those skilled in the art, to form a raised epitaxial silicon-containing film 450 on the silicon substrate 410. In general, the patterned film 420 can include at least one of an oxide mask (e.g., SiO₂) and a nitride mask (e.g., Si₃N₄). The use of selective deposition of epitaxial silicon-containing films can be used for manufacturing silicon-on-insulator (SOI) devices with a raised source and drain regions. During SOI device fabrication, processing may consume an entire silicon film in source and drain regions, thereby requiring extra silicon in these regions that can be provided by selective epitaxial growth (SEG) of silicon-containing films. Selective epitaxial deposition of silicon-containing films can reduce the number of photolithography and etch steps that are needed, which can reduce the overall cost and complexity involved in manufacturing a device.

Figure 4D:
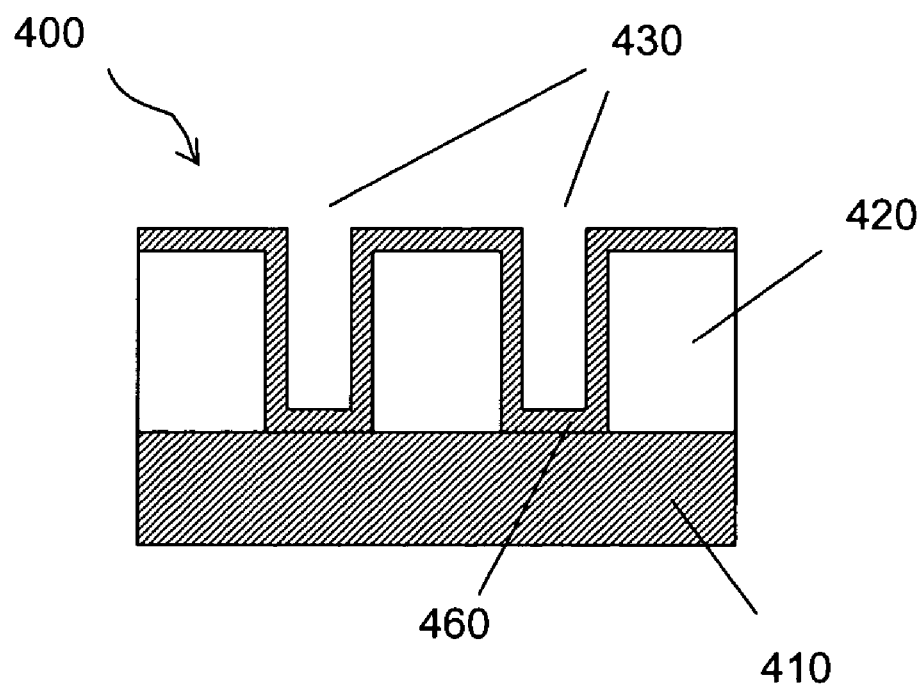

FIG. 4D shows the patterned structure 400 following non-selective (blanket) deposition of a silicon-containing film 460 onto the patterned structure 400. According to one embodiment of the invention, the film 460 can be a silicon film. The silicon film 460 can be deposited on the patterned structure 400 with substantially uniform thickness, regardless of the type of materials comprising the substrate 410 and the patterned film 420. In one example, the silicon film 460 can be formed on the patterned structure 400 using a process gas containing $Si_2Cl_6$, a substrate temperature of about 500° C. or greater. In another example, a process gas containing $Si_2Cl_6$ and $SiH_4$ may be used. As would be appreciated by those skilled in the art, the crystal structure of the deposited silicon-containing films can be a function of processing conditions, including substrate temperature, process pressure, and gas composition.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method for processing a substrate, comprising:
   providing the substrate in a process chamber, the substrate containing an oxide layer formed thereon;
   exciting a hydrogen-containing gas in a remote plasma source coupled to the process chamber;
   exposing the substrate to a flow of the excited hydrogen-containing gas at a first substrate temperature lower than about 900° C. to remove the oxide layer from the substrate;
   maintaining the substrate at a second substrate temperature different than the first substrate temperature, wherein said first substrate temperature is less than said second substrate temperature; and
   forming a silicon-containing film on the substrate by exposing the substrate to a silicon containing gas comprising $Si_2Cl_6$ while the substrate is at the second substrate temperature.

2. The method according to claim 1, wherein the hydrogen-containing gas comprises H₂ gas.

3. The method according to claim 1, wherein the hydrogen-containing gas further comprises an inert gas.

4. The method according to claim 3, wherein the inert gas comprises Ar, He, Ne, Kr, or Xe, or a combination of two or more thereof.

5. The method according to claim 1, wherein a flow rate of the hydrogen-containing gas is between about 0.010 slm and about 20 slm.

6. The method according to claim 1, wherein the silicon-containing gas further comprises $SiH_4$, $SiCl_4$, $Si_2H_6$, or $SiH_2Cl_2$, or a combination of two or more thereof.

7. The method according to claim 6, wherein the silicon-containing gas further comprises a germanium-containing gas containing $GeH_4$ or $GeCl_4$, or a combination thereof.

8. The method according to claim 1, wherein the exposing and forming are performed at a process chamber pressure of less than about 100 Torr.

9. The method according to claim 1, wherein the exposing and forming are performed at a process chamber pressure less of than about 10 Torr.

10. The method according to claim 1, wherein said providing comprises providing the substrate in a batch processing chamber.

11. The method according to claim 1, wherein the substrate comprises a silicon-containing material.

12. The method according to claim 11, wherein the silicon-containing material comprises silicon, SiGe, SiGeC, SiC, SiN, SiCN, or SiCO.

13. The method according to claim 1, wherein the silicon-containing film comprises poly-Si, amorphous silicon, epitaxial silicon, or silicon germanium.

14. The method of claim 1, wherein said first substrate temperature is less than about 500° C.

15. The method according to claim 1, wherein said first substrate temperature is between about 200° C. and about 300° C.

16. The method according to claim 1, wherein the second substrate temperature is between about 500° C. and about 900° C.

17. The method according to claim 1, wherein the second substrate temperature is between about 550° C. and 750° C.

18. The method according to claim 1, wherein the substrate comprises a patterned substrate containing one or more vias or trenches, or combinations thereof.

19. The method according to claim 1, wherein the silicon-containing film is selectively formed on an exposed silicon-containing surface of the substrate.

20. The method according to claim 1, wherein the silicon-containing film is non-selectively formed on the substrate.

21. The method of claim 1, wherein said exciting comprises exciting a hydrogen-containing gas in a remote plasma source that is not in line of sight of the substrate.

22. The method of claim 1, further comprising not exposing the substrate to ambient air during a time between the step of exposing the substrate and the step of forming a silicon-containing film.

23. A method of forming a silicon containing film on a substrate, comprising:
   providing a plurality of silicon containing substrates in a batch process chamber, the silicon containing substrates each having at least one of an oxide containing mask or a nitride containing mask provided thereon such that an exposed surface of the silicon containing substrate is exposed through the mask, the exposed surface having an oxide layer thereon;
   exciting a hydrogen-containing gas in a remote plasma source coupled to the batch process chamber;
   exposing the plurality of silicon containing substrates to a flow of the excited hydrogen-containing gas at a first substrate temperature of lower than about 500° C. to remove the oxide layer from each of the plurality of silicon containing substrates;
   increasing a temperature of the plurality of silicon containing substrates to a second substrate temperature of at least 550° C.; and
   selectively forming a silicon containing film on the exposed surface of each of the plurality of silicon containing substrates by exposing the plurality of silicon containing substrates to a process gas including $Si_2Cl_6$.

24. A method of forming a silicon containing film on a substrate, comprising:

proviing a plurality of silicon containing substrates in a batch process chamber, the silicon containing substrates each having at least one of an oxide containing mask or a nitride containing mask provided thereon such that an exposed surface of the silicon containing substrate is exposed through the mask, the exposed surface having an oxide layer thereon;

exciting a hydrogen-containing gas in a remote plasma source coupled to the batch process chamber;

exposing the plurality of silicon containing substrates to a flow of the excited hydrogen-containing gas at a first substrate temperature of lower than about 500° C. to remove the oxide layer from each of the plurality of silicon containing substrates;

increasing a temperature of the plurality of silicon containing substrates to a second substrate temperature of at least 550° C.; and non-selectively forming a silicon containing film on the surface of each of the plurality of silicon containing substrates by exposing the plurality of silicon containing substrates to a process gas including $Si_2Cl_6$.

* * * * *